United States Patent [19]

Stengl et al.

[11] Patent Number: 4,891,547
[45] Date of Patent: Jan. 2, 1990

[54] PARTICLE OR RADIATION BEAM MASK AND PROCESS FOR MAKING SAME

[75] Inventors: Gerhard Stengl, Villach; Hans Löschner, Wien, both of Austria

[73] Assignee: IMS Ionen Mikrofabrikations Systeme Gesellschaft GmbH, Wien, Austria

[21] Appl. No.: 205,535

[22] Filed: Jun. 10, 1988

Related U.S. Application Data

[63] Continuation of Ser. No. 930,806, Nov. 13, 1986, abandoned.

[30] Foreign Application Priority Data

Nov. 13, 1985 [AT] Austria .............................. A3310/85

[51] Int. Cl.$^4$ .......................... H01J 29/07; G01J 1/00
[52] U.S. Cl. .................................. 313/407; 250/505.1; 445/29; 445/47
[58] Field of Search ....................... 313/402, 407, 408; 250/503.1, 505.1; 445/29, 30, 47

[56] References Cited

U.S. PATENT DOCUMENTS

| | | | |
|---|---|---|---|
| 2,625,734 | 1/1953 | Law .................................. | 313/408 X |
| 3,271,488 | 9/1966 | Dahlberg .............................. | 264/81 |
| 3,936,691 | 2/1976 | Bakker et al. ....................... | 313/407 |
| 4,370,556 | 1/1983 | Stengl et al. ........................ | 250/503.1 |
| 4,536,226 | 8/1985 | Ohtake et al. ....................... | 313/402 X |

FOREIGN PATENT DOCUMENTS

| | | |
|---|---|---|
| 372218 | 2/1976 | Austria . |
| 371947 | 12/1979 | Austria . |
| 1160107 | 3/1916 | Fed. Rep. of Germany . |
| 160801 | 7/1984 | Fed. Rep. of Germany . |
| 1163495 | 9/1969 | United Kingdom . |

OTHER PUBLICATIONS

Stengl et al., "Electron-beam, X-ray, and Ion Beam Techniques For Submicrometer Lithographics", The Int. Soc. for Optical Eng., IV V.1537, pp. 138-145, May 14-15, 1985.

Burggraaf, Editor, "Research in Ion Projection Lighography", *Semiconductor International*, In-Depth News, Jul. 1985.

Stengl et al., "Ion Projection System for IC Production," J. Vac. Sci. Technol., 16(6), Nov./Dec. 1979, pp. 1883-1885.

Stengl, "Ion Projection Microlithography For Submicron Device Fabrication", J. Vacuum Science Tech., vol. 19, No. 1 May/Jun. 1981, pp. 1164-1165.

Stengl et al., "Ion Projection Microlithography", *Microcircuit Engineering 81*, Int. Conf. on Microlithography, Switzerland, Sep. 28-30, 1981.

Stengl et al., "Ion Projection Microlithography", *Solid State Technology*, Aug. 1982, vol. 25, No. 8, pp. 104-109.

Vacuum Science & Technology, vol. 19, No. 4, Nov., Dec. 1981, Edit: G. Lucovsky; pub. for the American Vacuum Society by the American Institute of Physics, 81, pp. 1164-1165.

*Primary Examiner*—Kenneth Wieder

[57] ABSTRACT

The mask of our invention can be used in image forming units, for example in ion projection microlithography. The mask comprises a mask foil clamped into a retaining frame. The mask foil has a larger thermal expansion coefficient than the retaining frame. To make this mask the mask foil and retaining frame are heatead to a higher temperature than room temperature and clamped in position at this temperature.

7 Claims, 1 Drawing Sheet

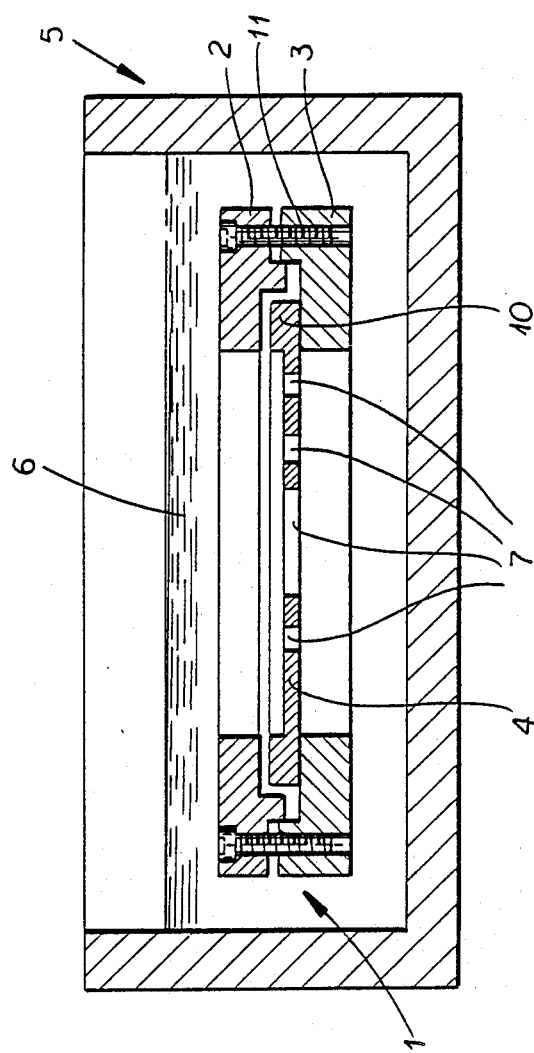

PARTICLE OR RADIATION BEAM MASK AND PROCESS FOR MAKING SAME

This is a continuation of application Ser. No. 930,806 filed Nov. 13, 1986, now abandoned.

FIELD OF THE INVENTION

Our present invention relates to a particle or radiation beam mask, particularly for use in an image forming unit such as an ion projection unit, e.g. for making integrated circuits or wherever an image of the mask of a projection screen is to be formed on a substrate with a high-energy beam, e.g. of corpuscular character.

BACKGROUND OF THE INVENTION

A particle beam or radiation projection screen generally has a mask permeable to the image forming medium, i.e. a high-energy beam, at least at one point and has a thermal expansion coefficient which is different from the thermal expansion coefficient of a retaining frame so that by a temperature change the mask foil is put under tension so that the foil is in a planar state.

It is already known to provide a metallic mask foil in the tubular glass body of a cathode ray tube (British Patent 1 163 495).

Since glass has a coefficient of thermal expansion which is less than that of a metal, tension—in as much as the mask foil is anchored in the heated state in the glass material—is produced in the mask foil when it cools down.

The anchoring must according to British Patent 1 163 495 occur at a higher temperature than the crystallization point in order to melt the glass body. On subsequent cooling to room temperature the metal mask foil is put under a considerable tension to the point that the elastic limit of the foil material can be exceeded so that plastic changes occur in the mask foil.

OBJECTS OF THE INVENTION

It is an object of our invention to provide an improved radiation or particle beam mask and process for making same which avoid the aforedescribed drawback.

It is another object of our invention to provide an improved particle or radiation beam mask and process for making same in which the mask foil after mounting is provided with tension which is within its elastic limit.

It is a further object of our invention to provide an improved particle or radiation beam mask and process for making same in which the mask foil remains planar under a temperature load to which it is subjected in its mount, e.g. by the high-energy beam, in order to guarantee an accurate and true image formation of the beam-permeable regions of the mask foil on the substrate.

SUMMARY OF THE INVENTION

These objects and others which will become more readily apparent hereinafter are attained in accordance with our invention in a particle beam or radiation mask, e.g. an ion projection microlithography screen, comprising a retaining frame for a mask foil, the mask foil being permeable to an image forming medium at least at one point and having a thermal expansion coefficient which is different from the thermal expansion coefficient of the retaining frame so that by a temperature change the mask foil is put under tension and the mask foil is held in a state in which it is planar. A process for making this radiation or particle beam mask is also provided.

According to our invention this is achieved when the thermal expansion coefficient of the mask foil preferably composed of metal, e.g. nickel, is greater than the thermal expansion coefficient of the retaining frame preferably also composed of metal, particularly INVAR steel a steel having a negligible thermal coefficient of expansion, so that by cooling the mask comprising the mask foil and the retaining frame the mask foil is put under tension in the retaining frame and the mask foil is mechanically clamped in the retaining frame formed by an upper frame member and a base member with its edge region lying between these frame members.

By mechanical clamping according to our invention a melting process with the aforementioned problems is avoided. The retaining frame is made from a material which can be easily worked mechanically or machined.

The structure, according to our invention, of the mask guarantees that also under a permanent particle beam or radiation load the mask retains its planarity.

In contrast to the known masks in which a foil of nickel is held in a glass frame a greater flexibility in the selection of material for the mask foil and the retaining frame results. Thus the danger of tearing under the greater radiation load is avoided since in an extreme case the mask foil of the invention sags through the frame; after cooling however it again returns to the planar state and can again be used. In the mask formed according to our invention the thermal stress is only limitedly reduced by the image forming thermal load on the mask of the high-energy beam.

For applications in which the mask is provided, e.g. in an ion projector, although with an increasing temperature the tension in the mask decreases, no changes occur in the positions of the openings and/or the contours of the permeable regions in the mask foil.

The mask according to our invention can be made in an easy way by a process in which the mask foil jointly with the retaining frame is heated to a temperature above room temperature, for example in the temperature range from 50°-100°C. Then the mask foil is clamped in the retaining frame. The mask foil is cooled to a temperature at which the tension in the mask foil is within the elastic limit and reaches at maximum this elastic limit. The heating of the mask foil and/or the retaining frame can be effected in a liquid bath although it can also be carried out in an air stream or in a stream of other heated gases. BRIEF DESCRIPTION OF THE DRAWING The above and other objects, features and advantages of our invention will become more readily apparent from the following description, reference being made to the accompanying highly diagrammatic drawing in which the sole FIGURE is a cross sectional view through a particle beam or radiation mask according to our invention.

SPECIFIC DESCRIPTION

A retaining frame 1 for a mask foil 4 is shown in the drawing to constitute a projection screen for a high energy, e.g. corpuscular, beam of image-forming radiation.

The mask foil 4 can have a reinforced edge regions as indicated at 10 in the drawing by the thicker edge regions to make manipulation easier.

The retaining frame comprises advantageously an upper frame member 2 and a base member 3. The mask foil 4 is clamped between the base member 3 and the upper frame member 2 by the screws 11. In the drawing the upper frame member 2 is shown in a position raised slightly from the base member 3, i.e. its position before clamping.

The mask foil 4 has regions 7 which are permeable to an image forming medium, for example ion beams, an electron beam or the like. A nickel foil is preferably used as a mask foil 4. The thickness of the mask foil 4 typically amounts to a few micrometers, for example 3 to 5 micrometers but can however be less than that (e.g. 0.5 micrometer). The thickness of the mask foil 4 at an individual position can be greater or less than the above value. The mask foil 4 can be 5 mm×5 mm in size.

In operation, that is, in projecting an image of the regions 7 permeable to the image forming radiation on a substrate the mask foil 4 is advantageously irradiated perpendicularly to its surface for example by the ion or an electron beam.

Because of the interception of a portion of the beam, the mask foil 4 is put under a considerable thermal load since it corresponds to a load on the mask foil 4 with ions with an energy of 10 KeV and with an ion current density of 10 microamperes per $cm^2$.

In order to have an accurate structural information transfer from the mask foil to the substrate the mask foil 4 must remain planar during the irradiation. Hence the mask foil 4 is held under tension in the retaining frame 1. The tension on the mask foil 4 must also be present during operation. In order to guarantee the production of this tension the thermal expansion coefficient of the mask foil 4 is greater than the thermal expansion coefficient of the retaining frame 1. On cooling after clamping the mask foil 1 the tension in the mask foil 4 climbs. At the storage temperature the mask comprised of the retaining frame 1 and the clamped mask foil 4 provides a tension in the mask foil 4 in the elastic region, i.e. within its elastic limit. A lasting deformation of the mask foil 4 is thus prevented. For the frame advantageously material different from glass can be used, preferably INVAR-steel.

In order to provide the mask foil 4 with the desired tension, the mask foil 4 together with both parts of the retaining frame 1 are brought to a temperature above room temperature, for example a temperature of 60° C. or more. That can occur—as is indicated in the drawing—when the base member 3, the upper frame member 2 and the mask foil 4 are immersed in a fluid bath 6 in a container 5 having the desired temperature and are left there until the individual components have equilibrated with the bath temperature.

Then the base member 3 and the upper frame member 2 are clamped together by tightening of the screws 11, the edges 10 of the mask foil 4 being in an intermediate position so that it is held fixed in the frame 1. By cooling the mask to the storage temperature, that is room temperature, the mask foil 4 is then put under tension since it contracts more strongly than the retaining frame 1. The maximum possible temperature of the mask foil under image forming medium load approaches the frame-tension-generating temperature when the retaining frame is made from a material with a very small thermal expansion coefficient.

We claim:

1. A method of providing a planarity-retaining image forming mask assembly adapted to form images by the passage of a high energy medium through at least one preselected region thereof comprising: providing a generally planar metal foil, having a first coefficient of thermal expansion and having at least one high energy medium permeable region therein; providing a frame member having a second, lower coefficient of thermal expansion than said foil; providing mechanical clamping means adapted to coincide with the outside edges of said foil when said clamping means is at a preselected elevated temperature; heating both of said frame member and said foil to said preselected elevated temperature such that said frame member clamping means and said foil outer edge regions coincide while maintaining the planarity of said foil; while in said heated condition, clamping said foil in said frame such that said foil is substantially planar and such that said foil outer edge regions and said clamping means coincide; and cooling said frame clamped foil mask assembly to ambient temperature thereby causing said foil to shrink more than said frame and thus causing said cooled foil to be planar and tensile stressed within said clamping means, the difference between said preselected elevated temperature and said ambient temperature, and the difference between said first and said second coefficients of thermal expansion, considered together, being insufficient to permit said cooling to plastically deform said foil.

2. The method according to claim 1 wherein said temperature to which said foil and said frame member are heated is between 50° and 100° C.

3. The method according to claim 1 and 2 wherein said frame member and said foil are brought to the same temperature in a heated liquid bath before clamping said foil in said frame member.

4. The image-forming mask according to claim 2 wherein said mask foil is composed of one metal and said clamping frame is composed of another metal.

5. The image-forming mask according to claim 4 wherein said mask foil is composed of nickel and said retaining frame member is composed of steel having a negligible coefficient of thermal expansion.

6. The image-forming mask according to claim 2, 4 or 5 wherein said clamping frame includes an upper frame member and a base frame member between which said mask foil is clamped.

7. An image forming mask assembly adapted to form images by exposure to a high energy medium comprising: planar metal foil having a first coefficient of thermal expansion and having at least one preselected region which is permeable to the passage of a high energy radiation medium; and a rigid frame comprising clamping means, having a second, lower coefficient of thermal expansion, mechanically holding said foil in a planar configuration under tensile stress will substantial elastic deformation and without substantial plastic deformation; said clamping means being of a size and shape to coincide with the size and shape of the outer edge regions of said foil when said foil and said clamping means are at a preselected elevated temperature but said clamping means being larger than the outer edge region of said foil at ambient temperature, the elastic deformation of said foil being sufficiently high that thermal expansion thereof resulting from exposure to said high energy radiation will not substantially reduce the planarity thereof.

* * * * *

UNITED STATES PATENT AND TRADEMARK OFFICE
CERTIFICATE OF CORRECTION

PATENT NO. : 4,891,547

DATED : January 2, 1990

INVENTOR(S) : Stengl et al.

It is certified that error appears in the above-identified patent and that said Letters Patent is hereby corrected as shown below:

On the title page, item [57] ABSTRACT:

Line 6, delete "heatead" and insert therefore -- heated

Column 2, line 51, "BRIEF DESCRIPTION OF THE DRAWING" should be on a separate line and centered as a heading.

Signed and Sealed this

Ninth Day of July, 1991

Attest:

Attesting Officer

HARRY F. MANBECK, JR.

Commissioner of Patents and Trademarks